United States Patent
Yamaguchi et al.

(10) Patent No.: US 6,613,449 B2
(45) Date of Patent: *Sep. 2, 2003

(54) UNDERFILL MATERIAL FOR COF MOUNTING AND ELECTRONIC COMPONENTS

(75) Inventors: Hiroaki Yamaguchi, Tokyo (JP); Masafumi Kohda, Ichihara (JP)

(73) Assignee: UBE Industries, Ltd., Yamaguchi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/058,112

(22) Filed: Jan. 29, 2002

(65) Prior Publication Data

US 2002/0142167 A1 Oct. 3, 2002

(30) Foreign Application Priority Data

Jan. 29, 2001 (JP) ........................................ 2001-020399

(51) Int. Cl.[7] .............................................. H01L 29/12
(52) U.S. Cl. ................. 428/620; 257/791; 257/792; 257/793; 528/27; 528/117; 528/405; 528/418
(58) Field of Search .................................. 257/791, 792, 257/793; 428/620; 528/27, 117, 405, 418

(56) References Cited

U.S. PATENT DOCUMENTS 6,506,869 B2 * 1/2003 Yamaguchi .................. 528/27

FOREIGN PATENT DOCUMENTS

JP 09-153570 6/1997

* cited by examiner

Primary Examiner—Robert Dawson
Assistant Examiner—D. Aylward
(74) Attorney, Agent, or Firm—Young & Thompson

(57) ABSTRACT

A solventless non-filler underfill material for COF mounting comprising an organic material, which is used to fill the gap between an FPC having a polyimide film substrate and a copper circuit layer having a thickness of 9 μm or smaller and an IC chip mounted on the FPC, exhibits such adhesion as to destroy a silicon wafer in a polyimide film/silicon wafer adhesion test, and provides a cured film having a tensile modulus of 150 kg/mm$^2$ or less.

7 Claims, 1 Drawing Sheet

UNDERFILL MATERIAL FOR COF MOUNTING AND ELECTRONIC COMPONENTS

FIELD OF THE INVENTION

The present invention relates to a solventless underfill material and an electronic component as an application of the underfill material. More particularly, it relates to an underfill material for chip-on-flex or chip-on-film (COF) mounting which comprises a low-elasticity organic material and is used to fill the gap between a flexible printed circuit board (FPC) composed of a polyimide film substrate and a thin copper film circuit formed thereon and an IC chip mounted thereon and to an electronic component having the underfill material.

BACKGROUND OF THE INVENTION

As the level of integration of semiconductor chips increases, flip chip packages in which a chip and a substrate are connected via bumps have been taking the place of chip-on-board packages such as pin grid array packages in which a chip and a substrate are connected by wire bonding. Spot sealing of the flip chip packages is carried out by using, as an underfill sealant, a flowable solventless one-pack type epoxy resin composition.

With the increasing integration scale of circuits, materials of the substrate have been changing from rigid materials such as glass-epoxy laminates to flexible films, typically polyimide films. However, conventionally employed underfill materials have insufficient adhesion to a polyimide film due to their high tensile modulus and therefore lack sufficient reliability.

The increasing degree of integration with the ever evolving functions of portable equipment is generating demands for both a copper layer and a polyimide film making FPCs to have a reduced thickness and for the underfill material to have a further decreased elastic modulus.

JP-A-9-153570 proposes an underfill material containing butadiene rubber particles and thereby having a reduced elastic modulus, but the butadiene rubber particles are difficult to disperse uniformly only to provide an underfill material with insufficient reliability in long term use.

SUMMARY OF THE INVENTION

An object of the present invention is to provide a solventless underfill material which exhibits sufficient adhesion to both a silicon wafer and a polyimide film and satisfactory molding properties, such as a low viscosity and capability of penetrating in a relatively short time, and is applicable to an FPC composed of a thin copper layer and a polyimide film.

Another object of the present invention is to provide an electronic component which uses an underfill material of low elastic modulus.

The present invention relates to a solventless non-filler underfill material for COF mounting comprising an organic material, which is used to fill the gap between an FPC having a polyimide film substrate and a copper circuit layer having a thickness of 9 μm or smaller and an IC chip mounted on the FPC, exhibits such adhesion as to destroy a silicon wafer in a polyimide film/silicon wafer adhesion test, and provides a cured product having a tensile modulus of 150 kg/mm² or less.

The present invention also relates to an electronic component having an IC chip fixed with the underfill material for COF mounting.

In this specification, "half-esterification" means esterification of tetracarboxylic dianhydride to dicarboxylic acid diester. "Penetrability", "penetration" and "penetrating" mean that the epoxy resin composition flows inwardly to fill a gap between a flip chip and a substrate due to the capillary phenomenon.

The language "comprising an organic material" as used herein is intended to mean that the underfill material does not contain an inorganic filler except pigments.

The present invention embraces the following preferred embodiments:

1) The underfill material further comprises carbon black.
2) The organic material is a one-pack type epoxy resin composition which comprises a low-viscosity epoxy resin and an acid anhydride hardener that is an imide oligomer having an imide unit and an acid anhydride end group, the imide unit being represented by formula (I):

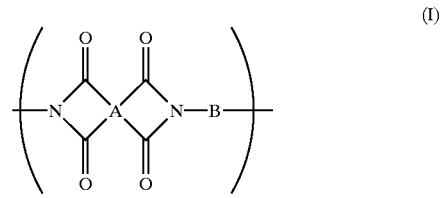

wherein A represents an asymmetric aromatic or alicyclic tetracarboxylic acid dianhydride residue; and B represents a diaminopolysiloxane residue, and which has a viscosity of 250 P (poise) or less at room temperature (25° C.).

3) The one-pack type epoxy resin composition comprises, as an acid anhydride hardener, an imide oligomer having an acid anhydride end group which is obtained by using an alicyclic tetracarboxylic acid dianhydride represented by formula (II):

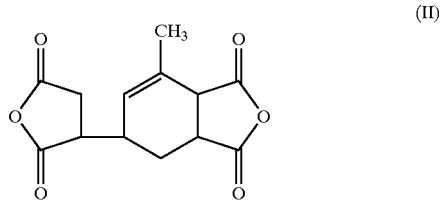

as the asymmetric aromatic or alicyclic tetracarboxylic acid dianhydride.

4) The one-pack type epoxy resin composition comprises an alicyclic acid anhydride hardener and/or a phenolic hardener, and the ratio of the total content of functional groups of all hardeners to the total epoxy group content is one equivalent or less.
5) The one-pack type epoxy resin composition further comprises a silane coupling agent.

BRIEF DESCRIPTION OF THE DRAWINGS

The present invention will be more particularly described with reference to the accompanying drawings, in which.

DETAILED DESCRIPTION OF THE INVENTION

Figure 1:
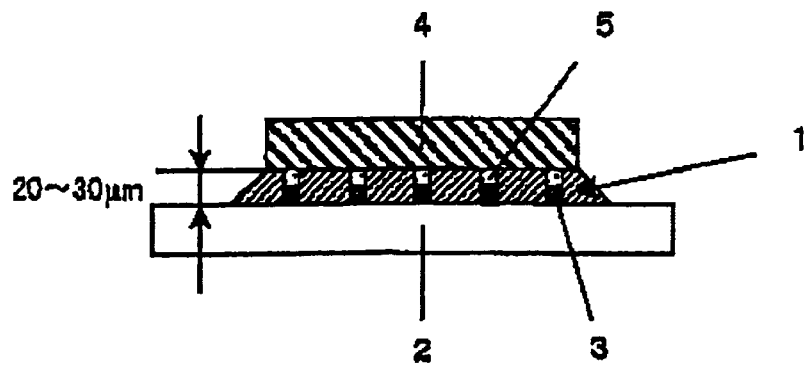
FIG. 1 is a schematic illustration of an IC chip with bumps mounted on an FPC composed of a polyimide film substrate and a copper circuit layer and sealed with an underfill material.

The present invention will be described with reference to FIG. 1 which is a schematic cross-section of a COF structure in which the underfill material of the invention is used. In FIG. 1, a cured underfill material 1 fills the gap between an FPC composed of a polyimide film 2 and a copper circuit layer 3 having a thickness of 9 μm or smaller and an IC chip 4 with bumps 5.

The FPC which can be used in the present invention is obtained by patterning a copper-clad laminate (CCL) (a direct laminate of a polyimide film and a copper layer) by a well-known etching technique.

The CCL providing the FPC is composed of a polyimide film and a copper layer having a thickness of preferably 1 to 9 μm, specifically 2 to 9 μm and is prepared by a lamination method, a casting method or a sputtering method. A preferred CCL is composed of a polyimide film having a thickness of 10 to 100 μm and a copper layer having a thickness of 9 μm or smaller.

Patterning by etching is usually carried out as follows. An etching resist is printed on the metallic side of a CCL in a wiring pattern to give a patterned protection over a copper layer against etching. The unprotected copper layer is etched with an etchant well known in the art, and the resist is then removed to expose the copper trace. It is preferred for the lines of the wiring pattern thus formed to have a width of 10 μm or smaller and be spaced at 10 μm or less.

The lamination method for preparing a CCL for use in the present invention is suitably carried out as follows. A polyimide adhesive is applied to at least one side of a heat-resistant polyimide film of which the side or sides have been subjected, if desired, to a discharge treatment, such as a plasma discharge treatment or a corona discharge treatment. Copper foil is superposed on the polyimide adhesive layer, followed by hot lamination under pressure. Otherwise, a thermocompression bondable multilayer extruded polyimide film obtained by co-extruding a thermoplastic polyimide layer on at least one side of a highly heat-resistant aromatic polyimide layer is laminated with copper foil by means of a thermocompression bonding apparatus, such as a double belt press. The casting method preferably comprises applying a solution of a thermocompression bondable polyimide precursor to copper foil and, after heat drying the coating, applying a solution of a highly heat-resistant aromatic polyimide precursor followed by heat drying to form a polyimide layer on the copper foil. The sputtering method preferably comprises applying a solution of a flexible polyimide precursor thin to a self-supporting film made from a solution of a highly heat-resistant aromatic polyimide precursor followed by heat drying to prepare a multilayer polyimide film, depositing copper on the flexible polyimide layer side by sputtering, and forming a metallic layer thereon by plating. If desired, the flexible polyimide layer on which copper is to be deposited is subjected to a discharge treatment, such as a plasma discharge treatment.

The underfill material of the present invention is of solventless non-filler type. It comprises an organic material and exhibits, on curing, such adhesion as to destroy a silicon wafer, preferably an adhesive strength of 2 kg or higher, in a polyimide film/silicon wafer adhesion test and a tensile modulus of 150 kg/mm² or less, preferably 1 to 150 kg/mm², still preferably 1 to 100 kg/mm².

The organic material which can make such an underfill material preferably includes a one-pack type epoxy resin composition obtained by mixing a low-viscosity epoxy resin and the above-described acid anhydride hardener which is an imide oligomer having an acid anhydride end group.

The low-viscosity epoxy resin includes those containing two epoxy groups per molecule and having a viscosity of about 0.01 to 120 P at room temperature (25° C.). Examples of suitable low-viscosity epoxy resins are an epoxy compound Araldite CY177 (available from Ciba Specialty Chemicals Corp., present Vantico Corp.) represented by formula (III) shown below, an epoxy compound Araldite CY179 (available from Ciba Specialty Chemicals Corp., present Vantico Corp.) represented by formula (IV) shown below, and an epoxy compound DY026SP (available from Ciba Specialty Chemicals Corp., present Vantico Corp.) represented by formula (V) shown below.

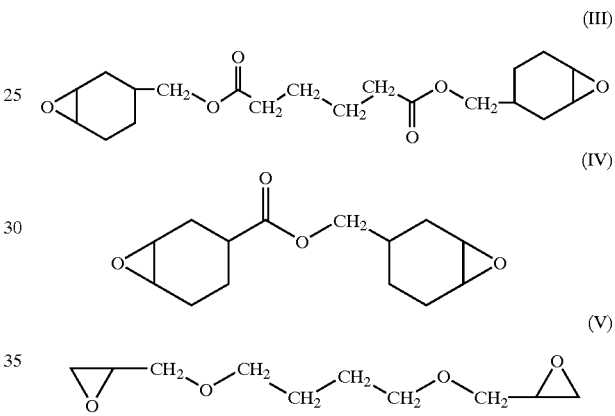

The asymmetric aromatic or alicyclic tetracarboxylic acid dianhydride which provides the imide oligomer hardener having an acid anhydride end group includes asymmetric aromatic tetracarboxylic acid dianhydrides, such as 2,3,3',4'-biphenyltetracarboxylic acid dianhydride; hydrogenated products of symmetric aromatic tetracarboxylic acid dianhydrides, such as dicyclohexyl-3,3',4,4'-tetracarboxylic acid dianhydride that is obtained from tetramethyl 3,3',4,4'-biphenyltetracarboxylate by reduction with hydrogen followed by hydrolysis under heat and pressure and followed by dehydration; and alicyclic tetracarboxylic acid dianhydride (Epiclon B4400) represented by formula (II):

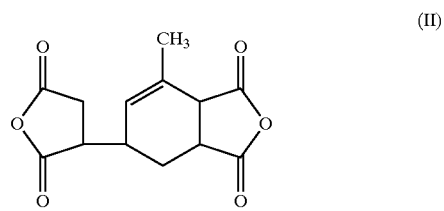

The diaminopolysiloxane which provides the imide oligomer hardener with an acid anhydride end group includes a diaminopolysiloxane represented by formula (VI):

wherein R represents a di- to hexamethylene group or a phenylene group; $R_1$, $R_2$, $R_3$, and $R_4$ each represent a lower alkyl group having 1 to 5 carbon atoms or a phenyl group; and n represents an integer of 3 to 60.

Examples of the diaminopolysiloxane are

α,ω-bis(2-aminoethyl)polydimethylsiloxane,
α,ω-bis(3-aminopropyl)polydimethylsiloxane,
α,ω-bis(4-aminophenyl)polydimethylsiloxane,
α,ω-bis(4-amino-3-methylphenyl)polydimethylsiloxane,
α,ω-bis(3-aminopropyl)polydiphenylsiloxane, and
α,ω-bis(4-aminobutyl)polydimethylsiloxane.

The imide oligomer having an acid anhydride residue at the terminal is preferably obtainable by once half-esterifying the asymmetric aromatic tetracarboxylic dianhydride or alicyclic tetracarboxylic dianhydride (A moiety) with an esterifying agent, particularly a primary alcohol having 4 or less carbon atoms under reflux for about 0.5 to 24 hours, cooling the reaction mixture, adding a diaminopolysiloxane moiety) to the reaction mixture at an A/B molar ratio of 1.2 to 5, preferably 1.5 to 3, heating the mixture in an inert gas stream first to evaporate the primary alcohol used for half-esterification in the initial stage and then to a temperature of 130° C. or higher but lower than 250° C., particularly 160 to 210° C., for about 0.5 to 24 hours while stirring to cause dehydration by one-pot reaction, and cooling the reaction mixture to give a substantially solvent-free product.

The esterifying agent for the half-esterification includes compounds having one alcoholic hydroxyl group, such as methanol, ethanol, isopropyl alcohol, butanol, ethyl cellosolve, butyl cellosolve, propylene glycol ethyl ether, and ethyl carbitol, particularly aliphatic alcohols having 4 or less carbon atoms.

The esterifying agent such as an aliphatic alcohol having 4 or less carbon atoms is preferably used in an amount of about 20 to 1000 parts by weight per 100 parts by weight of the tetracarboxylic dianhydride.

The epoxy resin composition comprising the low-viscosity epoxy resin and the acid anhydride hardener (imide oligomer having an acid anhydride group at the terminal) can further comprise other hardeners and accelerators.

Other useful hardeners include alicyclic acid anhydride hardeners and phenolic resin hardeners. Useful accelerators include hydrazides and imidazole compounds. For obtaining a solventless epoxy resin composition, it is particularly suitable in the present invention to use an alicyclic acid anhydride hardener Epicure YH306, available from Japan Epoxy Resin Co., Ltd.

If desired, the epoxy resin composition can further contain appropriate amounts of various anti-foaming agents, silane coupling agents, pigments, and the like, particularly carbon black.

The compounding ratio of the above-described components is decided so that the resulting composition may keep a liquid state at relatively low temperatures around room temperature (25° C.) without the aid of a solvent. A suitable amount of the imide oligomer having an acid anhydride end group is such that the total amount of the siloxane moiety is about 10 to 500 parts by weight per 100 parts by weight of the low-viscosity epoxy resin. In using the alicyclic acid anhydride hardener and/or the phenolic hardener in combination, the total content of the functional groups of all hardeners is preferably 1 equivalent or less, particularly 0.9 to 1 equivalent, per equivalent of total epoxy group content of the low-viscosity epoxy resin.

The amount of the silane coupling agent is preferably about 0.1 to 25 parts by weight per 100 parts by weight of the low-viscosity epoxy resin. The amount of carbon black is preferably about 0.1 to 3 parts by weight per 100 parts by weight of the organic material. Amounts of other additives, if added, are decided appropriately with reference to the techniques common in known one-pack type epoxy resin compositions.

It is suitable for the one-pack type epoxy resin composition to have a viscosity of about 0.1 to 250 P at 25° C. in view of molding properties, such as capability of penetrating at 50 to 100° C. in a relatively short time, and sealing properties.

In a preferred mode of the present invention, the underfill material of the present invention is applied to the gap between an FPC having a polyimide film substrate and a copper circuit having a thickness of 9 μm or smaller and an IC chip with bumps and cured by heating at a temperature of about 65 to 150° C. for about 2 to 120 minutes. This heating is preferably followed by second stage heating at about 150 to 200° C. for about 30 minutes to 8 hours. The first stage curing and the second stage curing are preferably carried out on separate lines.

It is preferred that the cured underfill has such heat resistance as to exhibit a dynamic viscoelasticity of $10^6$ dyn/cm$^2$ or more in a temperature range of from 50 to 150° C., particularly 50 to 200° C.

The underfill material and the electronic component according to the present invention will be illustrated in greater detail with reference to Examples. The viscosity of the hardener synthesized in Synthesis Example was measured with a cone-plate rheometer at 60° C. The viscosity and penetration time of underfill materials and the tensile modulus, adhesive strength, etc. of cured underfill materials were measured as follows.

a) Viscosity of Underfill Material

Measured with a cone-plate rheometer at 25° C.

b) Penetration Time of Cured Underfill Material

A glass cell for liquid crystal evaluation having a cell gap of 20 μm, available from E.H.C., was used. The cell was placed on a 80° C. hot plate, and the time required for a resin composition to penetrate into the gap to a depth of 1 cm was measured.

Estimation

Good: The penetration time is 120 seconds or shorter.

c) Tensile Modulus of Cured Underfill Material

A 4 mm wide dumbbell specimen blanked out of a cured resin composition was used. Measurement was made with Tensilon UTM-II-20 supplied by Orientec Corp. at a chuck distance of 30 mm and a pulling speed of 2 mm/min in accordance with ASTM D882.

d) Adhesive Strength of Cured Underfill Material

Figure 2:
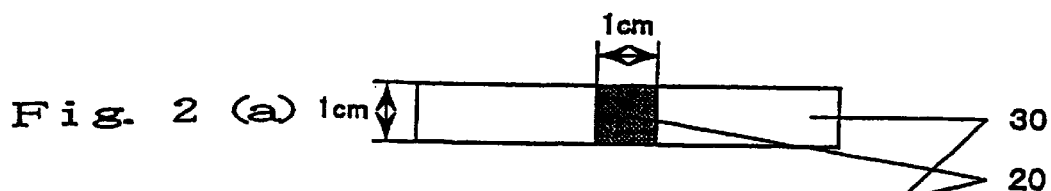
FIG. 2 represents a plan (FIG. 2A) and a cross-section (FIG. 2B) of a specimen prepared in Examples for evaluation of adhesive strength of a cured underfill material.
Figure 2:
Figure 3:
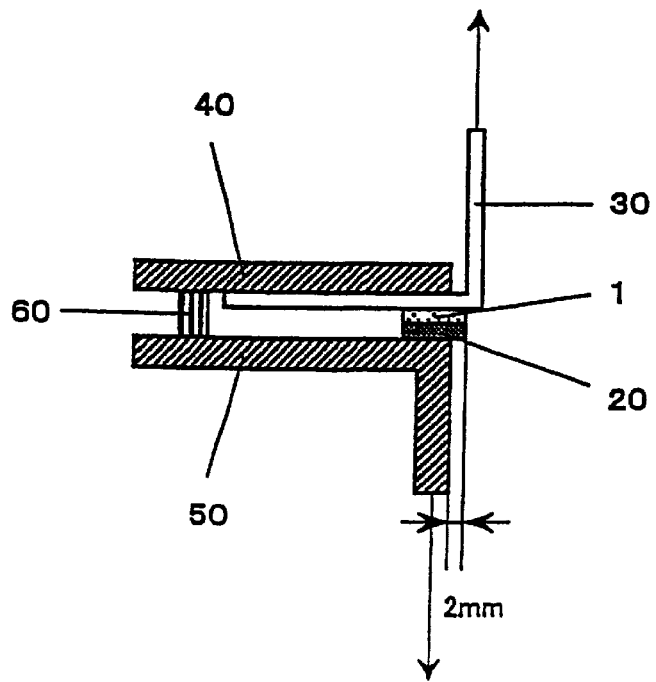
FIG. 3 is a schematic illustration of the method of measuring adhesive strength of the specimen shown in FIG. 2.

A specimen shown in FIG. 2 was prepared. An underfill material 1 was dropped on the middle of a 1 cm wide, 10 cm long and 25 μm thick polyimide film 30, and a 1 cm-side square of a silicon wafer 20 was placed thereon. The underfill material was cured by heating on a 135° C. hot plate for 15 minutes and then in a 180° C. oven for 1 hour. As shown in FIG. 3, the specimen was set on a tensile tester with the polyimide film 30 up and with the silicon wafer 20 sticking out by 2 mm from the edge of the upper presser foot 40. The polyimide film 30 was pulled up at a speed of 2 mm/min, and the load at the time when the film peeled off the silicon wafer 20 was taken as an adhesive strength. Numerals 50 and 60 in FIG. 3 indicate a fixture and a spacer, respectively. Separately, an adhesive strength of the cured underfill material was measured in the same manner, except for replacing the 25 μm thick polyimide film with 35 μm thick electrolytic copper foil.

Estimation

Good: No break is observed in the cured epoxy resin. (The silicon wafer broke.)

e) Glass Transition Temperature (Tg) of Cured Underfill Material

Measured with a thermal analysis system SSC5200 RDSC220, supplied by Seiko Instruments Inc., at a rate of temperature rise of 20° C./min in nitrogen.

f) Dynamic Viscoelasticity of Cured Underfill Material

The dynamic viscoelasticity vs. temperature of a cured underfill material was measured with a viscoelasticity analyzer (for solid) RSA II supplied by Rheometric Scientific F. E. Ltd. in a tensile mode with a step temperature rise of 3° C./step at a measuring frequency of 10 Hz with a strain of 0.05%.

g) Dielectric Constant of Cured Underfill Material

Measurement was made on a cured sample having a thickness of about 1 mm with an automatic dielectric loss measuring system R-1100 supplied by Ando Electric Co., Ltd. at a measuring frequency of 1 kHz at 23° C.

h) Volume Resistivity of Cured Underfill Material

Measurement was made on a cured sample having a thickness of about 1 mm with a dynamic condenser electrometer TR-8411 supplied by Advantest Corp. with an applied voltage of 100 V at 23° C.

i) Overall Judgement

Underfill materials which produce no voids on curing and show satisfactory results in a penetration test and of which a cured product has satisfactory dielectric characteristics (a volume resistivity of $10^{15}$ Ω·cm or higher), a small tensile modulus (150 kg/mm$^2$ or less), and sufficient heat resistance (a dynamic viscoelasticity of $10^6$ dyn/cm$^2$ or more in a temperature range of 50 to 150° C.) were graded "good". Those showing particularly satisfactory results were graded "excellent", and those poorer than "good" underfill materials were graded "poor".

Synthesis Example

In a four-necked flask equipped with a stirrer, an inlet for introducing nitrogen, a reflux condenser, and a stopper, 37.90 g (143.4 mmol) of Epiclon B4400 (alicyclic tetracarboxylic dianhydride available from Dainippon Ink & Chemicals, Inc.) and 50 g of methanol were put and refluxed for 3 hours, followed by cooling to room temperature. The reflux condenser was replaced with one equipped with a water separator, and 0.10 g of an anti-foaming agent FS Antifoam DB-100 (available from Dow Corning Asia) and 64.68 g (71.71 mmol) of a diaminopolysiloxane BY16-853U (amino-modified silicone oil; in formula VI, R=$C_3H_6$; $R_1$=$R_2$=$R_3$=$R_4$=$CH_3$; amine equivalent: 451; available from Dow Coming Toray Silicone Co., Ltd.) were added to the reaction mixture. After methanol was removed by evaporation over a 1-hour period, the temperature was raised up to 190° C. to allow the mixture to react for 1 hour while removing produced water to give 97.89 g (yield: 97.90%) of a brown viscous substance, which was designated SiB. The viscosity of SiB at 60° C. was 311 P.

EXAMPLE 1

A hundred gram of a low-viscosity epoxy resin DY026SP (available from Ciba Specialty Chemicals Corp., present Vantico Corp.), 140 g of the acid anhydride hardener SiB prepared in Synthesis Example, 141 g of an alicyclic acid anhydride Epicure YH306 (available from Japan Epoxy Resin Co., Ltd.), 1 g of an accelerator Curesol 2E4MZ (available from Shikoku Chemicals Corp.), and 7.6 g of a silane coupling agent KBM403 (available from Shin-Etsu Chemical Co., Ltd.) were mixed uniformly. The mixture was filtered through filter paper 408 (pore size: 5 μm; available from Advantec Toyo) and vacuum-degassed. The resulting solventless one-pack type epoxy resin composition had a viscosity of 3.1 P and showed satisfactory penetrability into the 20 μm gap.

The resin composition was cured on a 100° C. hot plate for 1 hour and then in a 180° C. oven for 2 hours. The resulting cured product had a tensile modulus of 23 kg/mm$^2$, a TG of 35° C., a dielectric constant of 3.4 and a volume resistivity of 1.8×10$^{15}$ Ω·cm. The cure time (gel time) of the resin composition separately measured at 150° C. was 5 minutes.

A polyamic acid solution as a precursor of a thermocompression bondable polyimide which was prepared from 1,3-bis(4-aminophenoxy)benzene and 2,3,3',4'-biphenyltetracarboxylic acid dianhydride and a polyamic acid solution as a precursor of a highly heat-resistant aromatic polyimide which was prepared from p-phenylenediamine and 3,3',4,4'-biphenyltetracarboxylic acid anhydride were co-extruded to prepare a thermocompression bondable multilayer polyimide film having a thickness structure of 3 μm/14 μm/3 μm (total thickness: 20 μm), in which the thermocompression bondable polyimide had a Tg of 250° C. The thermocompression bondable multilayer polyimide film was laminated with electrolytic copper foil having a thickness of 9 μm (available from Mitsui Mining & Smelting Co., Ltd.) by continuous thermocompression bonding followed by cooling through a double belt press to obtain a single-sided CCL. The CCL was processed in a usual manner to obtain an FPC having a 9 μm-thick copper circuit layer.

An IC chip was mounted on the FPC, and the solventless one-pack type epoxy resin composition was applied to the gap between the FPC and the IC ship and bumps and cured to obtain an electronic component.

EXAMPLES 2 and 3

And Comparative Example

A solventless one-pack type epoxy resin composition was obtained in the same manner as in Example 1, except for using Araldite CY177 (Example 2) or CY179 (Example 3), both available from Ciba Specialty Chemicals Corp., present Vantico Corp. in place of DY026SP or replacing SiB with an increased amount of Epicure YH306 (Comparative Example) so as to have the composition shown in Table 1 below. The resulting resin composition and its cured product were evaluated in the same manner as in Example 1. The results obtained are shown in Table 1. It is seen from the results that all the cured underfill materials of Examples 1 to 3 had a dynamic viscoelasticity of 10$^6$ dyn/cm$^2$ or higher, proving sufficiently heat resistant.

TABLE 1

|  | Example 1 | Example 2 | Example 3 | Comparative Example |
|---|---|---|---|---|
| Composition (g): | | | | |
| DY026SP | 100 | | | 100 |
| CY177 | | 100 | | |
| CY179 | | | 100 | |
| SiB | 140 | 87.2 | 127 | |
| YH306 | 141 | 87.8 | 128 | 187 |

TABLE 1-continued

| | Example 1 | Example 2 | Example 3 | Comparative Example |
|---|---|---|---|---|
| 2E4MZ | 1 | 1 | 1 | 1 |
| KBM403 | 7.6 | 5.5 | 7.1 | 5.7 |
| Results of Evaluation: | | | | |
| Viscosity (P) | 3.1 | 27.2 | 23.8 | 0.6 |
| Penetrability into 20 μm Gap | good | good | good | good |
| Adhesion | good | good | good | good |
| Tg (° C.) | 35 | 72 | 124 | — |
| Tensile Modulus (kg/mm$^2$) | 23 | 114 | 120 | 213 |
| Dielectric Constant | 3.4 | 3.2 | 3.0 | — |
| Volume Resistivity (Ω · cm) | $1.8 \times 10^{15}$ | $1.7 \times 10^{16}$ | $1.6 \times 10^{16}$ | — |
| Overall Judgement | excellent | good | good | poor |

EXAMPLE 4

The epoxy resin composition of Example 1 was uniformly mixed with 0.7 wt % carbon black to prepare an underfill material. As a result of evaluation in the same manner as in Example 1, the resulting underfill material was proved satisfactory, being equal to the underfill material of Example 1, in penetrability, mechanical properties, adhesion, and electrical properties.

The foregoing results indicate that the underfill materials of Examples 1 to 4 and their cured products are superior to Comparative Example in terms of a reduced modulus while retaining satisfactory molding properties and adhesion. The adhesive strength measured in Examples 1 to 4 was 2 kg or higher in every case.

According to the present invention, there is provided a solventless underfill material which exhibits satisfactory molding properties (i.e., a low viscosity enough for rapid penetration at relatively low temperature) and provides a cured product having a small elastic modulus and sufficient adhesion to both a silicon wafer and a polyimide film.

Further, the present invention provides electronic components in which a sealant has a low elastic modulus and high adhesive strength.

What is claimed is:

1. A solventless non-filler underfill material for COF mounting comprising an organic material, which is used to fill the gap between a flexible printed circuit board having a polyimide film substrate and a copper circuit layer having a thickness of 9 μm or smaller and an IC chip mounted on the flexible printed circuit board, exhibits such adhesion as to destroy a silicon wafer in a polyimide film/silicon wafer adhesion test, and provides a cured product having a tensile modulus of 150 kg/mm$^2$ or less.

2. The underfill material for COF mounting according to claim 1, which further comprises carbon black.

3. The underfill material for COF mounting according to claim 1, wherein said organic material comprises a one-pack type epoxy resin composition which comprises a low-viscosity epoxy resin and an acid anhydride hardener that is an imide oligomer having an imide unit and an acid anhydride end group, said imide unit being represented by formula (I):

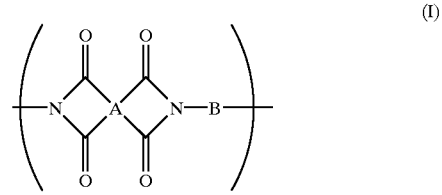

wherein
A represents an asymmetric aromatic or alicyclic tetracarboxylic acid dianhydride residue; and
B represents a diaminopolysiloxane residue, and which has a viscosity of 250 P or less at room temperature (25° C.).

4. The underfill material for COF mounting according to claim 3, wherein said imide oligomer is an imide oligomer obtained by using an alicyclic tetracarboxylic acid dianhydride represented by formula (II):

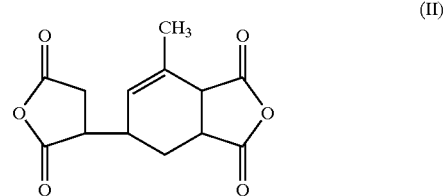

as an asymmetric aromatic or alicyclic tetracarboxylic acid dianhydride.

5. The underfill material for COF mounting according to claim 3, wherein said one-pack type epoxy resin composition contains an alicyclic acid anhydride hardener or a phenolic hardener or both, and the total content of functional groups of all hardeners present in said composition is one equivalent or less based on the total epoxy group content of said composition.

6. The underfill material for COF mounting according to claim 3, wherein said one-pack type epoxy resin composition further comprises a silane coupling agent.

7. An electronic component having an IC chip fixed with the underfill material for COF mounting according to claim 1.

* * * * *